United States Patent [19]

Zafiropoulo et al.

[11] Patent Number: 4,473,435
[45] Date of Patent: Sep. 25, 1984

[54] PLASMA ETCHANT MIXTURE

[75] Inventors: Arthur W. Zafiropoulo, Manchester; Joseph A. Mayer, Jr., Hamilton, both of Mass.

[73] Assignee: Drytek, Wilmington, Mass.

[21] Appl. No.: 477,961

[22] Filed: Mar. 23, 1983

[51] Int. Cl.$^3$ .................. H01L 21/30; C03C 15/00; C03C 25/06; B44C 1/22
[52] U.S. Cl. .................. 156/643; 156/646; 156/657; 156/659.1; 156/662; 204/192 E; 252/79.1
[58] Field of Search ............ 156/643, 646, 657, 659.1, 156/662; 204/192 E; 252/79.1

[56] References Cited

U.S. PATENT DOCUMENTS 4,162,185  7/1979  Coburn et al. .................. 252/79.1 X
4,314,875  2/1982  Flamm .......................... 156/659.1 X

OTHER PUBLICATIONS

Plasma Chemistry and Plasma Processing, vol. 2, No. 1, 1982, Plasma-Assisted Etching, by S. W. Coburn, pp. 1-41.

Primary Examiner—William A. Powell
Attorney, Agent, or Firm—Weingarten, Schurgin, Gagnebin & Hayes

[57] ABSTRACT

Method and apparatus for masked etching of a polysilicon surface layer or film to expose a dielectric underlying layer or film on a semiconductor material using ion bombardment from an ionized mixture of a fluorine based gas with a chlorine or bromine containing gas. A particularly useful gas is a mixture of sulfur hexafluoride and Freon 115 gases ($C_2ClF_5$). The mixture of gases achieves the result of highly selective etching through the polysilicon film without significantly attacking the underlying dielectric film and without significant undercutting in the polysilicon film or etching of the masking layer.

12 Claims, 20 Drawing Figures

OVERETCH = 0%

115/SF6-25/25 SCCM

B

115/SF6-12.5/25 SCCM

115/SF6-25/50 SCCM

115/SF6-50/25 SCCM

115/SF6-50/50 SCCM

F

115/SF6-50/100 SCCM

115/SF6-75/37.5 SCCM

115/SF6-75/75 SCCM

FIG. 13

115/SF6-75/150 SCCM

0% OVERETCH
*FIG. 15*

B

20% OVERETCH
*FIG. 16*

FIG. 17

40%OVERETCH

80%OVERETCH

FIG. 18

PLASMA ETCHANT MIXTURE

FIELD AND BACKGROUND OF THE INVENTION

At many points in the manufacture of semiconductor chips, a semiconductor wafer is etched in a pattern defined by the apertures of an overlying mask. Plasma etching of several of the layers of thin films on semiconductor wafers is used as a more effective alternative to wet chemical etching. The specific thin film layer deposited or grown on the semiconductor wafer to be plasma etched is typically covered with an apertured mask and placed in a gaseous environment. The gases directly above the wafer are ionized by RF energy to create a plasma and ions are accelerated out of the plasma to impact the semiconductor wafer. Etching of the portions of the thin film exposed through the masked apertures is accomplished as a function of the reaction of the material to the impact energy of the bombarding ions and the chemical activity of the gaseous environment.

In one commonly encountered situation the semiconductor wafer surface comprises a layer having one or more polysilicon films overlying a layer of a dielectric such as silicon dioxide. It is typically desired to etch through one polysilicon film exposing but not etching the dielectric or silicon dioxide layer, while also avoiding etching of the organic polymer of the mask. It is additionally desired to directionally limit the etching so as to etch preferentially downward without significant lateral etching. This avoids substantial bias undercutting of the polysilicon film under the edges of the masking layer. Such undercutting is to be avoided since it limits the device density on the semiconductor.

The mechanisms of plasma etching appear to involve both physical and chemical components. The gas pressure, RF frequency and power density as well as the gas composition determine whether the major reaction is physical or chemical. A chemically active gas such as a fluorine based compound is effective to attack and etch a polysilicon film but generates a good deal of chemical undercutting. Other gases by themselves, such as a chlorine or bromine containing Freon, applied as an etching gas in the presence of ion bombardment, will etch with more directionality, avoiding undercutting. This appears to be due to the fact that the ions bombarding the substrate have sufficient energy to produce a more anisotropic film profile. In the semiconductor structure utilizing doped or undoped polysilicon over silicon dioxide, or other dielectric, chlorine or bromine containing gases can, however, attack the organic polymer masking materials causing possible dimensional changes. Such gases can also etch into the polysilicon and dielectric films creating a negative sidewall slope eroding to corner pockets which fail to fill in with subsequent coatings. These pocket voids can lead to poor electric performance of the completed semiconductor chip.

The semiconductor producer must therefore compromise, settling either for the problems of undercutting induced by the presence of a fluorine based etching gas or the problems of photomask attack or poor etch selectivity and voids in the pockets of the underlying film caused by the presence of chlorine or bromine in the gases.

SUMMARY OF THE INVENTION

In accordance with the teaching of the invention, it has been discovered that a gaseous mixture of a specific fluorine based and a specific chlorine based gas when used for plasma etching will avoid the deficiencies in undercutting without attacking the organic polymer masking material and without exhibiting the effects of non selective etching. In one particular mixture, sulfur hexafluoride ($SF_6$) and Freon 115 ($C_2ClF_5$) are mixed and ionized together in a region above a semiconductor wafer. Ions from the resulting plasma are attracted onto the wafer top surface of polysilicon to produce a highly selective etching of polysilicon but not the underlying silicon dioxide and without significant bias undercutting of the mask layer edges. The mixture of gases can be applied over a range of relative flowrates and over a broad pressure range. The combination is so effective in producing a uniform edge without undercutting and erosion of the underlying silicon dioxide layer and organic mask, contrasted to the effect of the gases individually, that the etching process can be permitted to proceed well beyond the point where the polysilicon film has been completely etched without producing undesired further lateral or depth etching into the region below the mask or underlying silicon dioxide layer.

The plasma is typically generated by coupling RF energy into the gaseous mixture producing ionization of the gas molecules. The RF signal is applied between the wafer and a parallel plate placed 5 to 50 millimeters above the wafer, with either the wafer or the plate, but not both, maintained at ground potential. The RF frequency can cover a broad range.

The invention is particular applicable to semiconductor wafers in which the silicon wafer is overlaid with a layer of silicon dioxide or other dielectric. A doped or undoped polysilicon film extends over the dielectric, and additional levels of polysilicon films are applied thereon as desired.

A different fluorine based gas such as $CF_4$ or $NF_3$ may be used instead of $SF_6$ with other forms of Freon, having either chlorine or bromine, as the etching mixture.

DESCRIPTION OF THE DRAWING

These and other features of the present invention are more fully described below in the solely exemplary detailed description and accompanying drawing of which.

DETAILED DESCRIPTION

The present invention contemplates combining a fluorine based gas with a chlorine or bromine containing Freon gas in a plasma etching technique to achieve a highly selective etching with limited undercutting.

Figure 1:
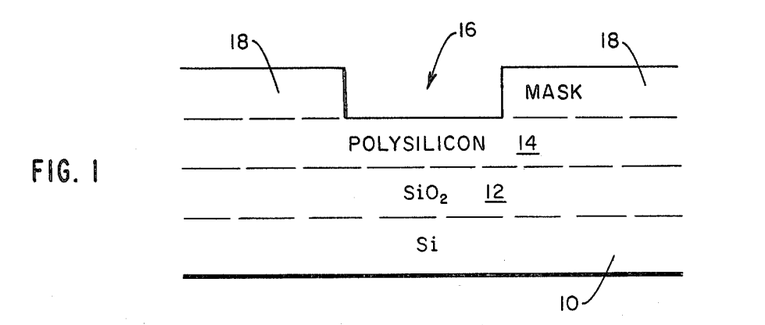
FIG. 1 is a diagram illustrating the typical layers in a pattern which is to be exposed to plasma etching.

As illustrated in FIG. 1, a common form of semiconductor wafer to which plasma etching is applied includes an underlying wafer 10 of a silicon material having thereover an insulating layer 12 of silicon dioxide or other dielectric. On top of the layer 12, a polysilicon layer or film 14, phosphorous doped or undoped, is typically applied. In the fabrication of semiconductor chips it is desired to etch through the polysilicon film 14 in apertures 16 defined by a mask 18 leaving the silicon dioxide layer 12 exposed for further processing. In actual application, there may be several polysilicon film layers present at any one time on the wafer.

Figure 2A:
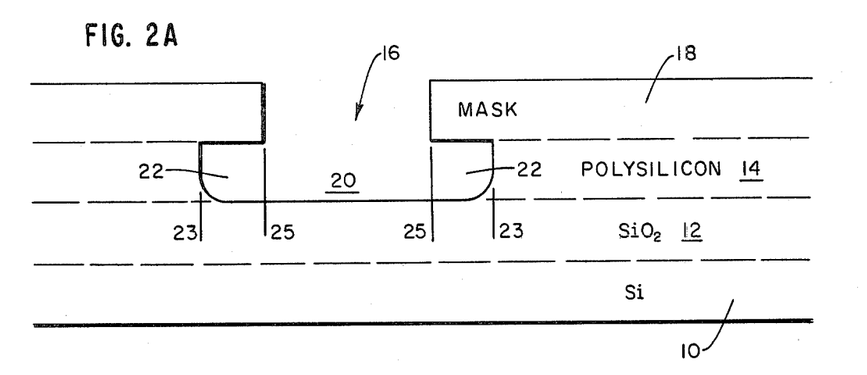
FIGS. 2A and 2B are respectively a diagram and a scanning electron microscope photograph illustrating undesirable etching in which undercutting of mask edges results from a fluorine based etching gas.
Figure 2B:
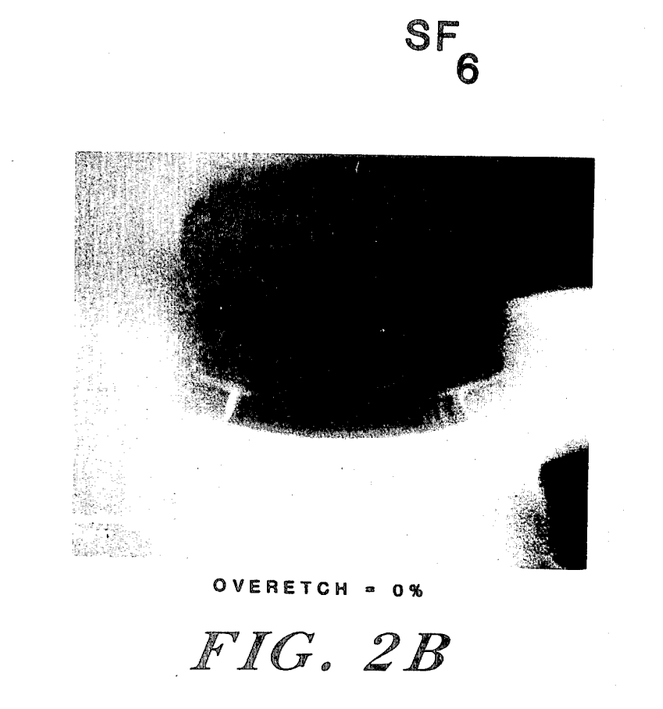

When the structure of FIG. 1 is subjected to plasma etching by a fluorine based gas, such as sulfur hexafluoride ($SF_6$), the typical results are as illustrated in FIG. 2A. As shown there, an etched trough 20 is produced exposing the silicon dioxide layer 12 but producing significant undercutting in regions 22 under the edges of the mask 18. Of particular concern is bias undercutting in which the edges 23 of the trough 20 are etched beyond the downward projections 25 of the edge of the mask 18. Such undercutting reduces the density of the elements on the semiconductor chip to be ultimately produced. FIG. 2B is a scanning electron microscope photograph illustrating an actual wafer etched by sulfur hexafluoride illustrating the deep undercutting produced by the fluorine based etchant. The etching shown in FIG. 2B demonstrates the case of substantially no over etch, in which the etching is stopped as soon as the silicon dioxide layer is exposed. This may not always be practical in order to insure complete exposure of the silicon dioxide and removal of the polysilicon film. However, as shown by FIG. 2B undercutting of the mask is very apparent. Any over etching will create further undercutting.

Figure 3A:
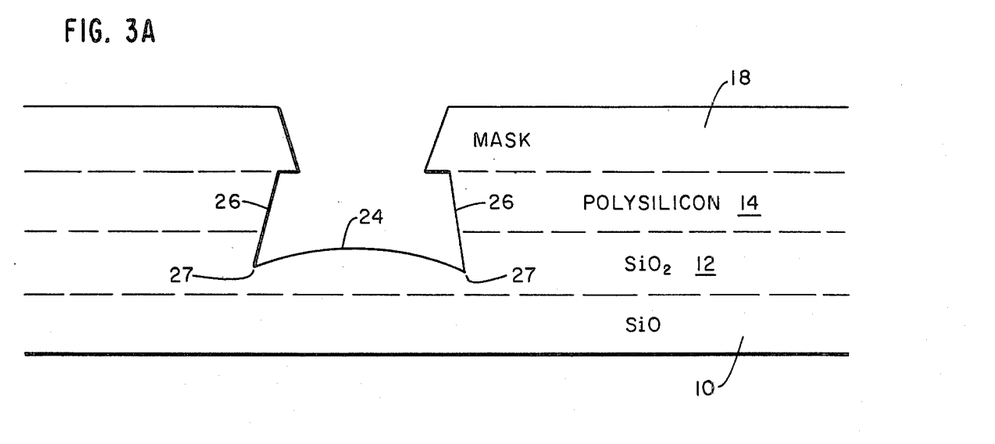
FIGS. 3A and 3B are respectively a diagram and a scanning electron microscope photograph illustrating undesired etching by chlorine or bromine based etchants in which the selectivity of etching between polysilicon and silicon dioxide layers is low and a negative slope is shown.
Figure 3B:
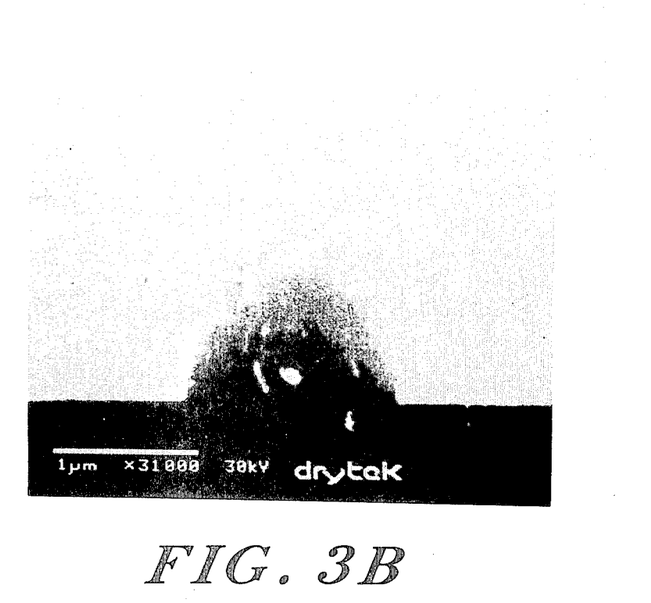

In FIG. 3A, the results of etching with a Freon 115 ($C_2ClF_5$) etchant gas is illustrated. A lack of selectivity in the etching manifests itself in erosion of the silicon dioxide layer 12 in a region 24, even though substantial undercutting beneath the mask 18 has been avoided. The etching has created side walls 26 with a negative slope, producing corners 27 which can create voids when a subsequent coating is applied. These voids can cause loss of electrical performance in the finished chip. The irregularity in the exposed silicon dioxide surface 12 is undesirable and may contribute to an actual breach through the silicon dioxide layer 12 into the underlined silicon layer 10. The photograph of FIG. 3B illustrates the negative slope directionality of a chlorine or bromine based plasma etch.

It has been discovered that by combining a fluorine based gas with a chlorine or bromine containing Freon gas, in particular sulfur hexafluoride ($SF_6$) with Freon 115 ($C_2ClF_5$), the effects illustrated in FIGS. 2A and 3A, which would be produced by the respective gases individually, are substantially avoided in the combination. The results from plasma etching with this combination of gases are illustrated by the scanning electron microscope photographs presented as FIGS. 6–18, showing an essentially anisotropic profile.

Figure 4:
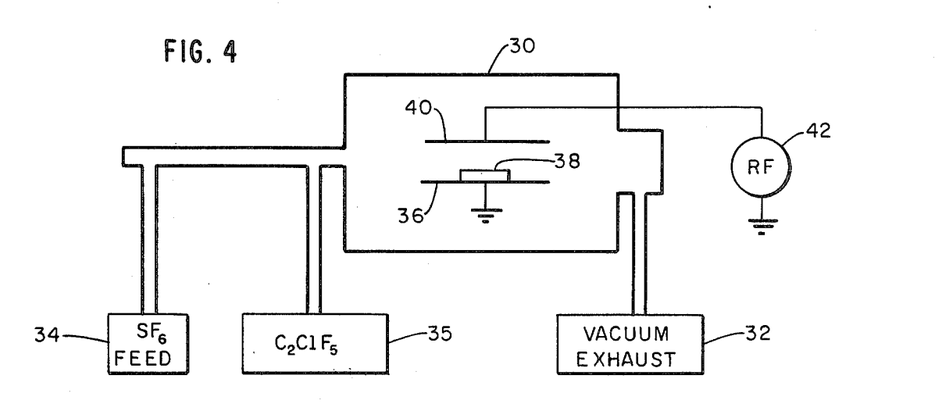
FIG. 4 is a diagram of apparatus useful in practicing the invention.

Apparatus for producing etching according to the present invention is illustrated in FIG. 4 in which a chamber 30, is evacuated by a vacuum exhaust system 32 and supplied with a feed gas. The feed comprises a mixture of sulfur hexafluoride applied from a source 34 and Freon 115 from a source 35.

Figure 5:
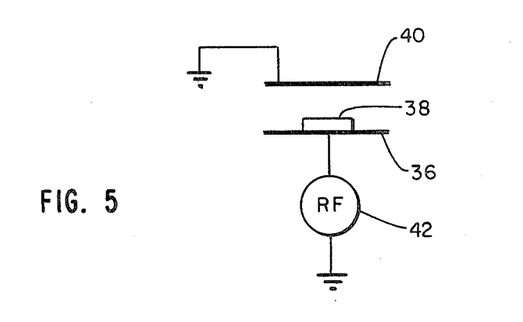
FIG. 5 is a diagram of a portion of the apparatus of FIG. 4 illustrating a modification thereto.
Figure 6:
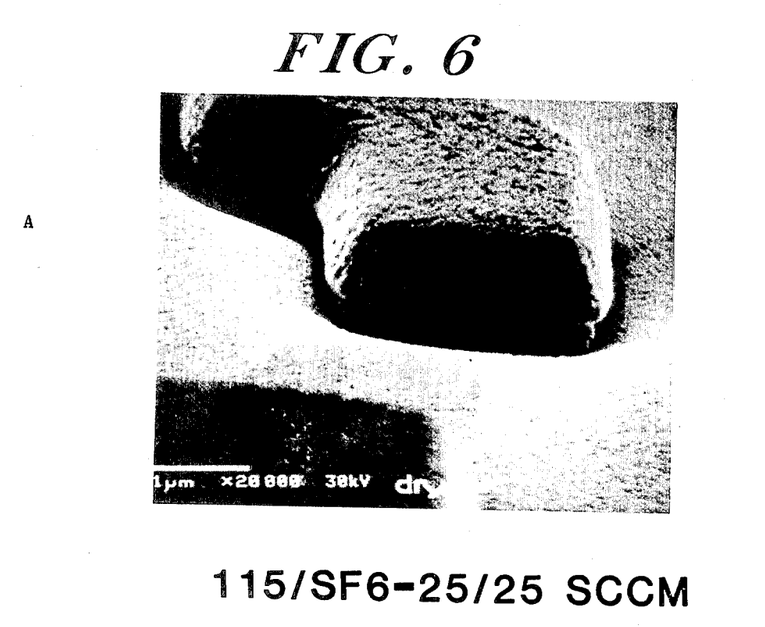
FIGS. 6–14 are scanning electron microscope photographs of the etching results of various combinations of the fluorine and chlorine based gases used in the mixture of the present invention.
Figure 7:
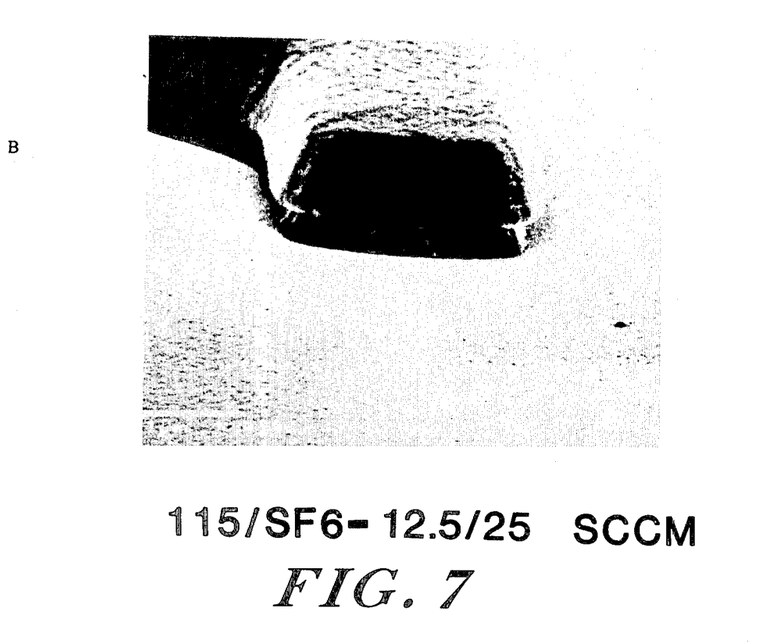
Figure 8:
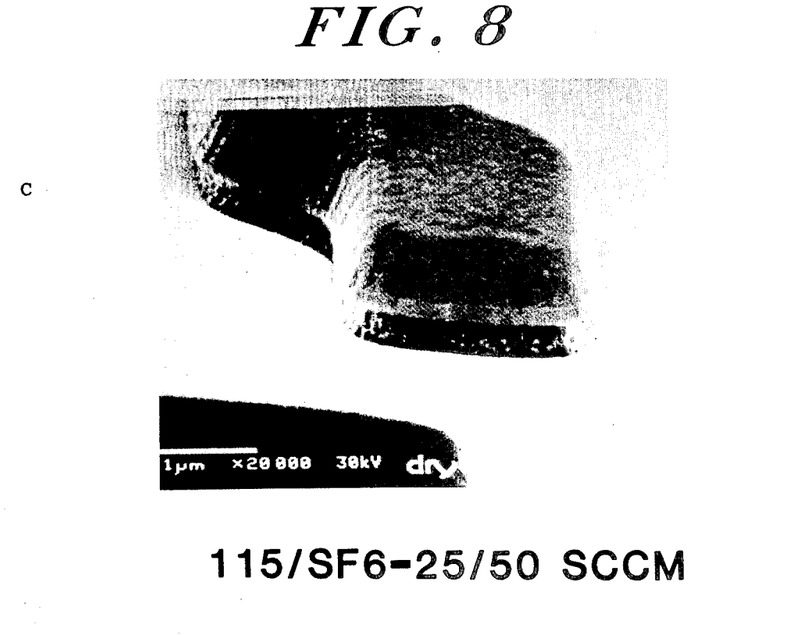
Figure 9:
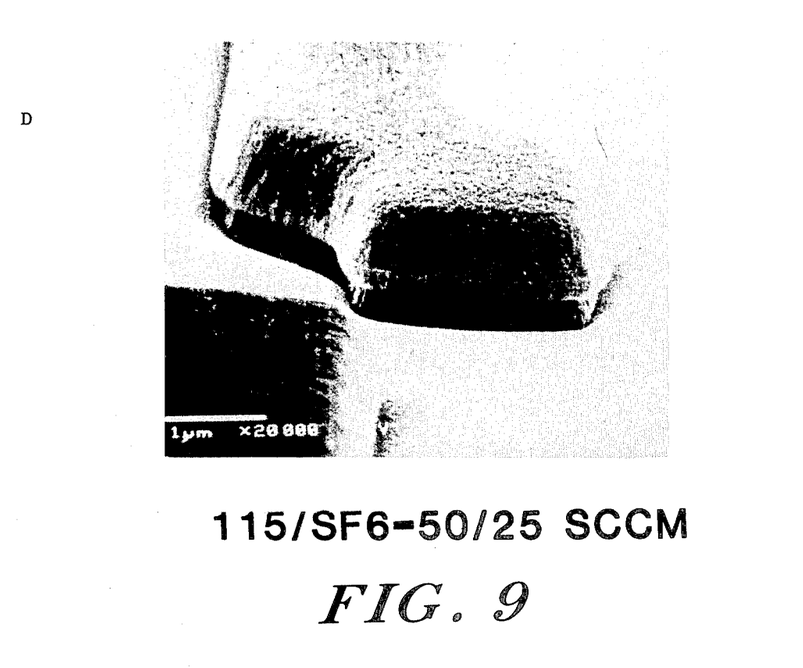
Figure 10:
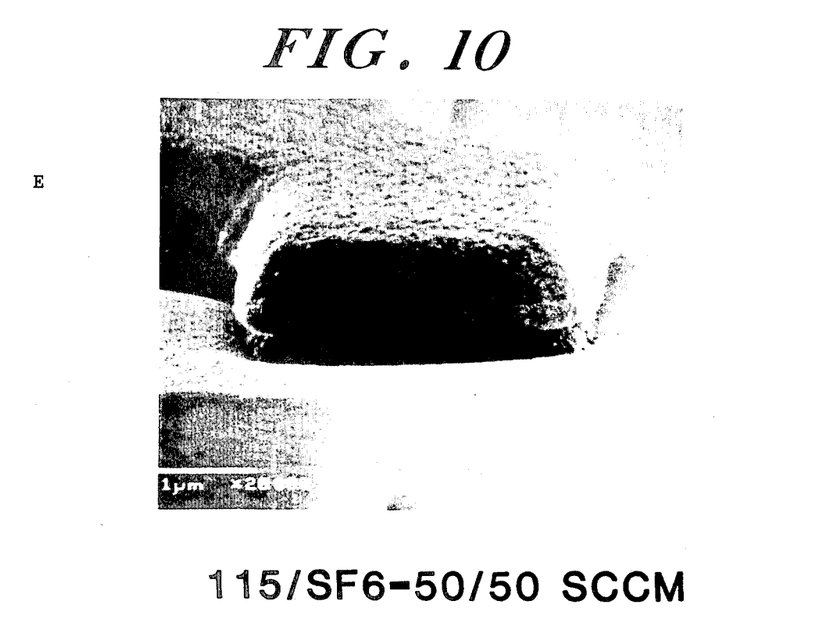
Figure 11:
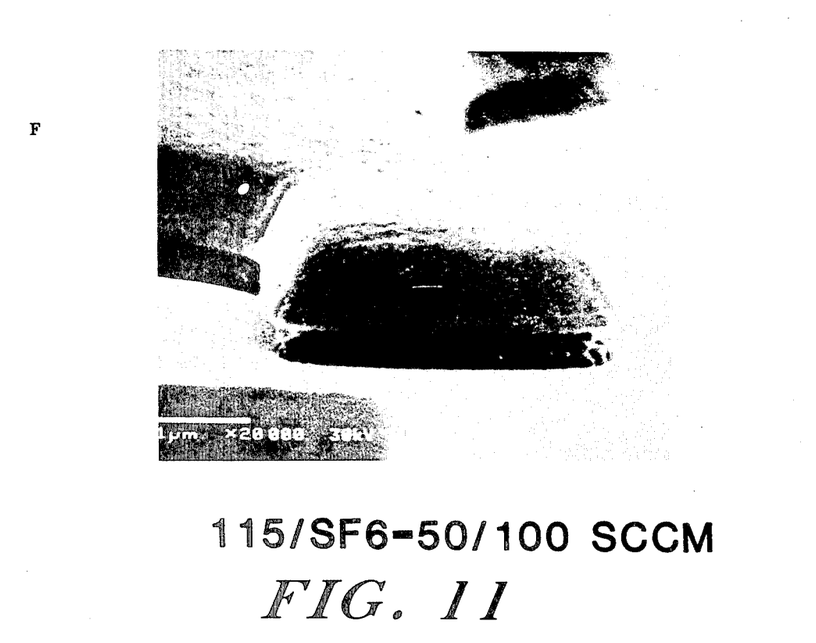
Figure 12:
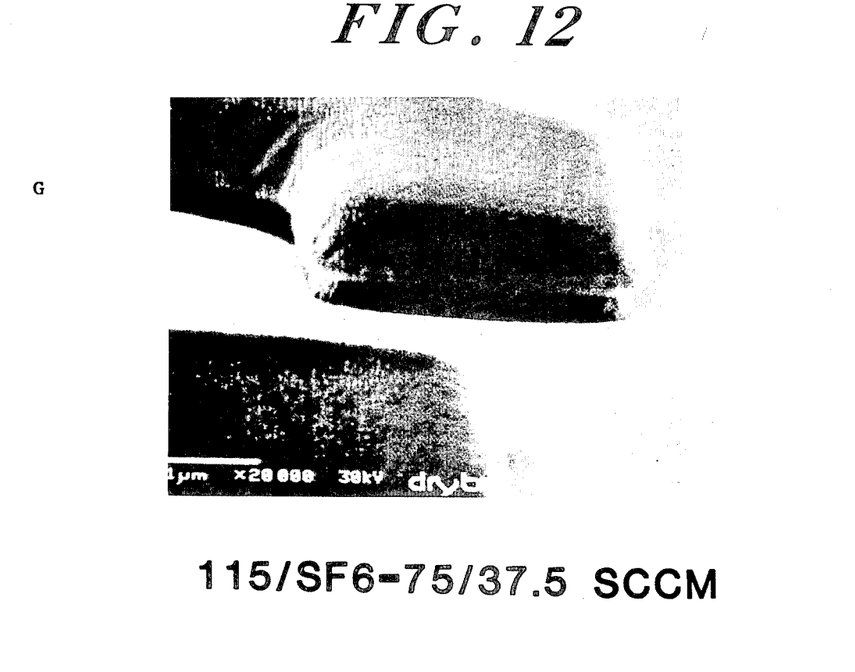
Figure 13:
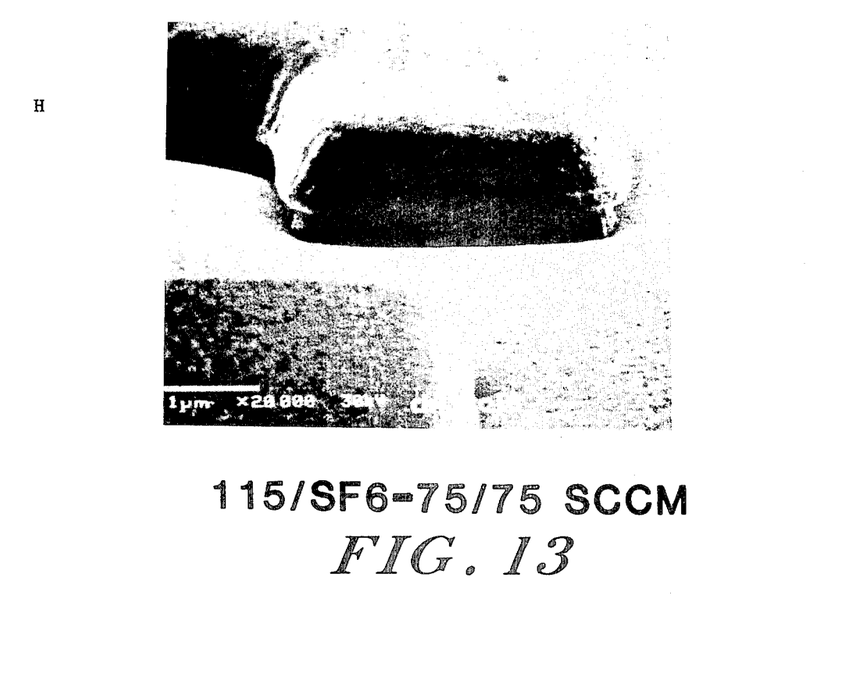
Figure 14:
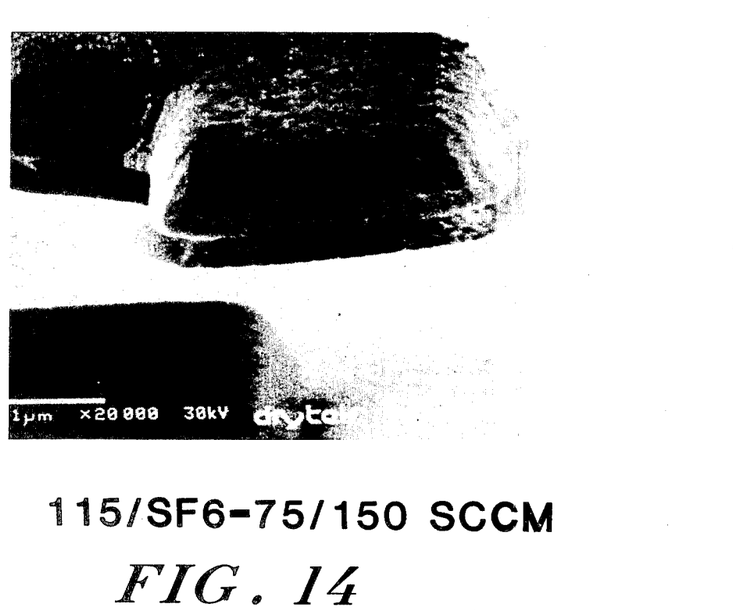

Within the chamber 30, a platform 36 supports a semiconductor wafer 38 to be etched. At 5 to 50 millimeters above the support 36 is a substantially parallel plate 40. An RF source 42 applies ionizing RF energy in the region between the support 36 and plate 40, generating a plasma above the wafer 38 and accelerating plasma ions downwardly onto the wafer 38. Commercially available equipment which may be utilized for this purpose is available from the Assignee of the present application, Drytek Incorporated. A typical model is the Drytek DRIE-100 etching system. FIG. 5 illustrates an alternative embodiment in which the plate 40 is grounded while the support 36 has the output of the RF generator 42 applied to it.

The atmosphere within the chamber 30 can be maintained in a partial vacuum having a pressure, typically, in the range of 0.001 TORR to 50 TORR. The RF source 42 may be operated within a rather broad frequency range, for example spanning 5 KHz to 50 MHz. Exemplary output powers for the RF source 42 are in the range of 100 watts or more. The flow rate, in SCCM, for the sulfur hexafluoride and Freon 115 ($C_2ClF_5$) gases from the sources 34 and 35 can be in the range of 12.5 SCCM to 175 SCCM and the relative flow rates can differ by a factor of at least 2 to 1 in both directions.

FIGS. 6–14 illustrate different combinations of flow rates for the sulfur hexafluoride and Freon 115 ($C_2ClF_5$) gases as designated, each illustrating the substantial uniformity in etch with little undercutting resulting from the practice of the present invention.

Figure 15:
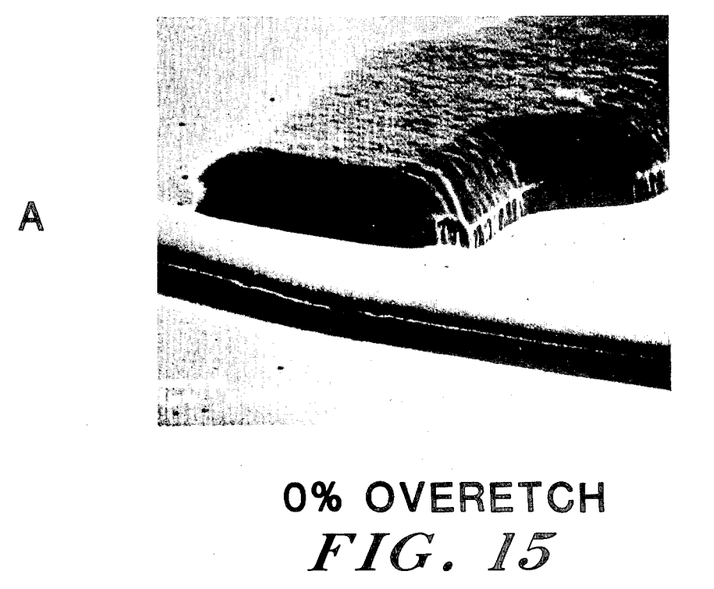
FIGS. 15–18 are scanning electron microscope photographs illustrating the consistency of etching results at various stages of over etching when using the present invention.
Figure 16:
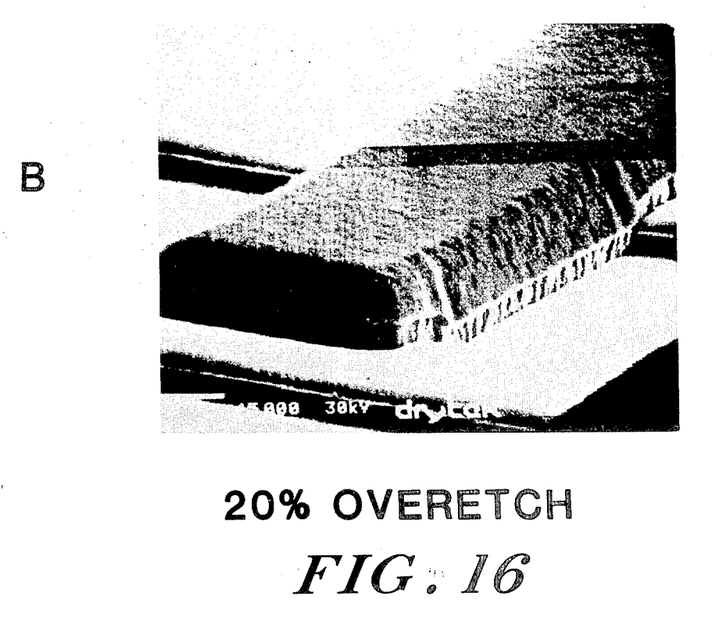
Figure 17:
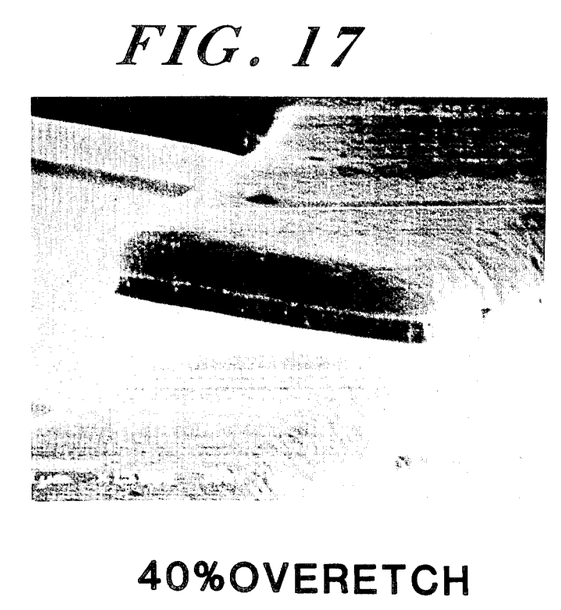
Figure 18:
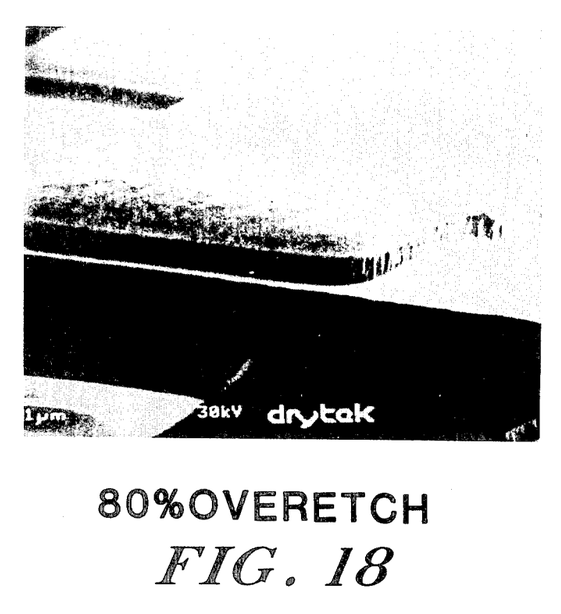

FIGS. 15–17 illustrate the effect of overetching, running the plasma etch process beyond the point necessary to achieve complete exposure of the silicon dioxide layer. As illustrated by the figures, each representing respective conditions of 0, 20, 40, and 80 percent over etching, there is relatively little effect upon the wafer. This indicates the high selectivity of etching in that little silicon dioxide or mask polymer are etched, even after extended periods. The figures also show that a very limited amount of undercutting is experienced even with extreme over etching.

As discussed above, plasma etching according to the present invention use a combination of gases, each known to produce a deleterious undercut or unselective etch into the underlined silicon dioxide or mask layer when utilized independently. The problems are avoided when the two gases are combined for etching as taught by the present invention. In addition to $SF_6$, $CF_4$ or $NF_3$ may be used as the fluorine based gas in combination with other chlorine or bromine containing Freons.

The specific examples given above are presented to illustrate the invention, the scope of which is limited only in accordance with the following claims.

What is claimed is:

1. A method for plasma etching of a polysilicon surface layer over a dielectric material comprising the steps of:

applying a mixture of sulfur hexafluoride and Freon 115 ($C_2ClF_5$) gases to the environment of said material;

generating a plasma within the mixture of gases; and directing ions from said plasma onto said polysilicon surface layer to produce anisotropic, selective etching of said polysilicon surface layer.

2. The method of claim 1 wherein said directing step includes directing said ions through a mask onto said polysilicon surface layer, achieving limited undercutting of the mask from the etching of the polysilicon surface layer.

3. The method of claim 1 wherein said step of applying said mixture includes the step of applying the mixture at a pressure within the range of pressures from 0.001 TORR to 50 TORR.

4. The method of claim 1 wherein said mixture applying step includes the step of applying the sulfur hexafluoride component of the mixture at a flow rate relative to said Freon 115 ($C_2ClF_5$) component within a range of from two to one-half.

5. The method of claim 1 wherein said mixture is applied within the range of flow rates of 25/12.5 SCCM Freon 115 ($C_2ClF_5$)/hexafluoride to 75/150 SCCM Freon 115 ($C_2ClF_5$)/hexafluoride.

6. The method of claim 1 wherein said step of generating a plasma includes the step of applying RF energy to said mixture of gases.

7. The method of claim 6 wherein RF energy is applied at a frequency within the range of 5 KHz to 50 KHz.

8. The method of claim 6 wherein the RE energy is applied in a configuration in which the material is at ground potential relative to the RF energy.

9. The method of claim 6 wherein the RF energy is applied to the material.

10. The method of claim 1 wherein said polysilicon layer is doped.

11. The method of claim 1 wherein said dielectric material is silicon dioxide.

12. A method for plasma etching of a polysilicon surface layer underlying an apertured mask and over a dielectric material comprising the steps of:

applying a mixture of a Freon (halogenated hydrocarbon containing one or more fluorine atoms) gas having a halide selected from the group consisting of chlorine and bromine atoms or combinations and a fluorine based gas selected from the group consisting of $SF_6$, $CF_4$, and $NF_3$, or combinations to the environment of said material;

generating a plasma within the mixture of gases; and directing ions from said plasma through the apertures in said mask onto said polysilicon layer;

achieving etching perpendicularly into said polysilicon layer without corresponding etching of said polysilicon layer under said mask or said dielectric material under said polysilicon layer, resulting in an essentially anisotropic profile.

* * * * *

UNITED STATES PATENT AND TRADEMARK OFFICE
CERTIFICATE OF CORRECTION

PATENT NO. : 4,473,435
DATED : September 25, 1984
INVENTOR(S) : Arthur W. Zafiropoulo; Joseph A. Maher, Jr.

It is certified that error appears in the above—identified patent and that said Letters Patent is hereby corrected as shown below: On the title page <u>In the inventors</u>: "Joseph A. Mayer, Jr." should read --Joseph A. Maher, Jr.--

Column 2  Line 9,   "non selective" should read --nonselective--

Line 34,  "is particular" should read --is particularly--

Column 6  Line 3,   "KHz." should read --MHz.--

Line 4,   "the RE energy" should read --the RF energy--

Signed and Sealed this

Twenty-sixth Day of November 1985

[SEAL]

Attest:

DONALD J. QUIGG

Attesting Officer

Commissioner of Patents and Trademarks